US009865601B2

(12) United States Patent
Lin et al.

(10) Patent No.: US 9,865,601 B2
(45) Date of Patent: Jan. 9, 2018

(54) SEMICONDUCTOR INTEGRATED CIRCUIT

(71) Applicant: TAIWAN SEMICONDUCTOR MANUFACTURING COMPANY LTD., Hsinchu (TW)

(72) Inventors: Kai-Chun Lin, Hsinchu (TW); Yu-Der Chih, Hsinchu (TW); Chia-Fu Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/971,461

(22) Filed: Dec. 16, 2015

(65) Prior Publication Data

US 2017/0179131 A1    Jun. 22, 2017

(51) Int. Cl.
  *H01L 27/11*   (2006.01)
  *H01L 27/105*  (2006.01)
  *H01L 27/02*   (2006.01)

(52) U.S. Cl.
  CPC ...... *H01L 27/1052* (2013.01); *H01L 27/0207* (2013.01)

(58) Field of Classification Search
  CPC ............. H01L 27/1052; H01L 27/0207; H01L 27/2436; H01L 27/2463; H01L 45/1233; G11C 2213/79
  See application file for complete search history.

(56) References Cited

U.S. PATENT DOCUMENTS

| 2007/0029676 A1* | 2/2007 | Takaura | G11C 13/0004 257/758 |
| 2007/0268742 A1* | 11/2007 | Liu | G11C 11/16 365/163 |
| 2014/0001568 A1* | 1/2014 | Wang | H01L 27/11286 257/379 |
| 2014/0146593 A1* | 5/2014 | Tsai | G11C 11/21 365/148 |

* cited by examiner

*Primary Examiner* — Allen Parker
*Assistant Examiner* — Frederick B Hargrove
(74) *Attorney, Agent, or Firm* — WPAT, P.C., Intellectual Property Attorneys; Anthony King

(57) ABSTRACT

The present disclosure relates to a semiconductor integrated circuit. The semiconductor integrated circuit includes a substrate, a first transistor and a first patterned conductive layer. The first transistor has a source region, a drain region in the substrate and a gate region on the substrate. The first patterned conductive layer is electrically connected to the drain region of the first transistor. The first patterned conductive layer includes a first section, a second section and a fusible device.

18 Claims, 17 Drawing Sheets

SEMICONDUCTOR INTEGRATED CIRCUIT

BACKGROUND

In a development stage of an integrated circuit, an application program of a control circuit, such as a central processing unit (CPU) or a microprocessor, is written to a read-only memory (ROM). Subsequently, in a production stage, the control circuit is made with this program stored in the ROM. The ROM may be made by photolithographic masking so that data recorded are defined by a particular photolithographic mask configuration. Moreover, each memory cell is constituted by a transistor. Binary data memorized in this cell are defined by the fact that the transistor has been masked or not masked during an operation of implantation for enhancement or depletion. Then, the integrated circuit is tested. If the application of the integrated circuit is a rather complex one, errors are liable to occur in the program. To correct the errors, it may be necessary to make an integrated circuit again, which includes the control circuit and a new corrected program. This implies using a new set of masks, resulting in a relatively costly and lengthy operation.

In order to provide flexibility in designing an integrated circuit, a random access memory (RAM) is used to store the application program of a control circuit. Errors of the application program may be corrected in the RAM and then the corrected program may be sent to the ROM to finalize the integrated circuit. Using an extra RAM may save time and cost as compared to changing ROM configuration. However, the extra RAM may inevitably occupy certain space or area, which may increase the size of the integrated circuit. Moreover, extra peripheral circuits are needed to control or support the extra RAM, which complicates circuit design and power management.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
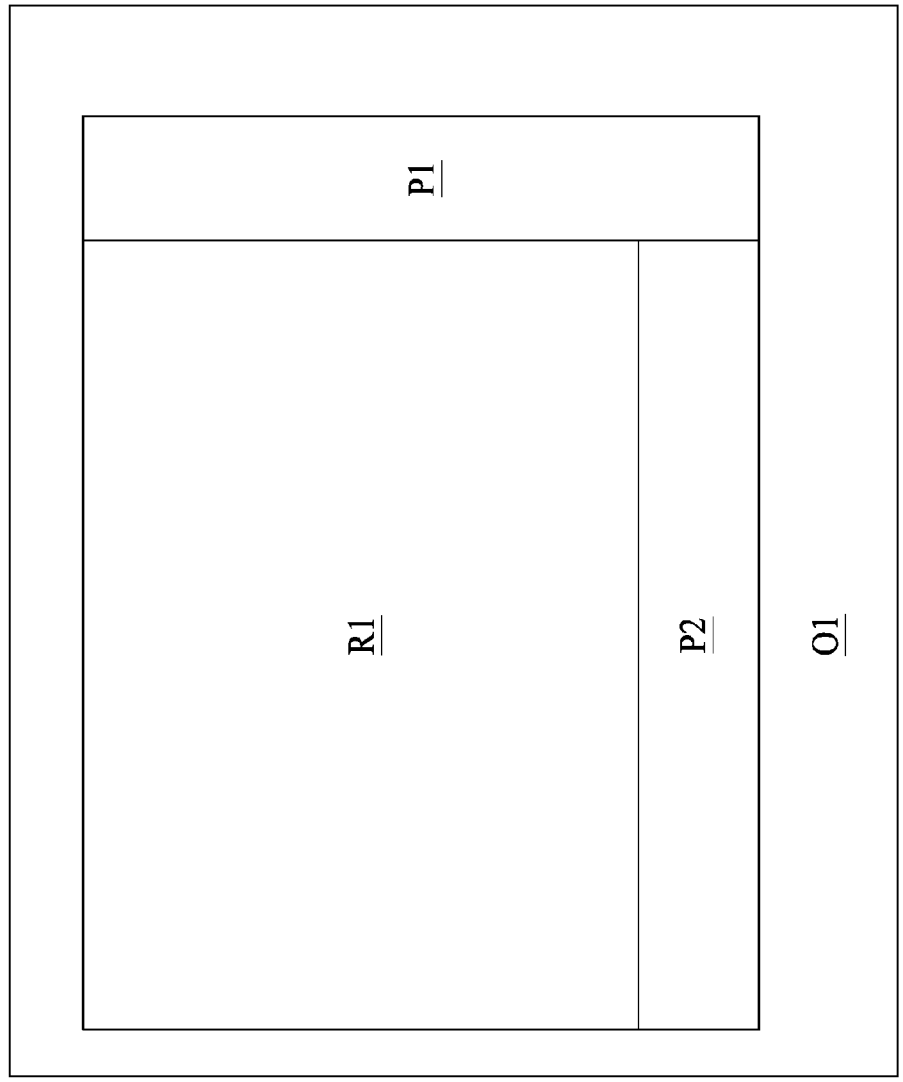
FIG. 1A is a block diagram illustrating an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a block diagram illustrating an integrated circuit in accordance with some embodiments.

Referring to FIG. 1A, a semiconductor integrated circuit 1 includes a memory device R1, peripheral devices P1, peripheral circuits P2 and other circuits O1.

The semiconductor integrated circuit 1 may include, for example, a processor, a microprocessor or the like, which functions to control one or more peripheral devices P1 such as a disk drive or the like.

The memory device R1 serves as internal storage in the semiconductor integrated circuit 1. The memory device R1 may contain an array of memory cells for storing data. The peripheral circuits P2, including row and column decoder circuits, are coupled to the array of memory cells for accessing the memory cells in response to an external address. The memory device R1 may include a random access memory (RAM).

Figure 1B:
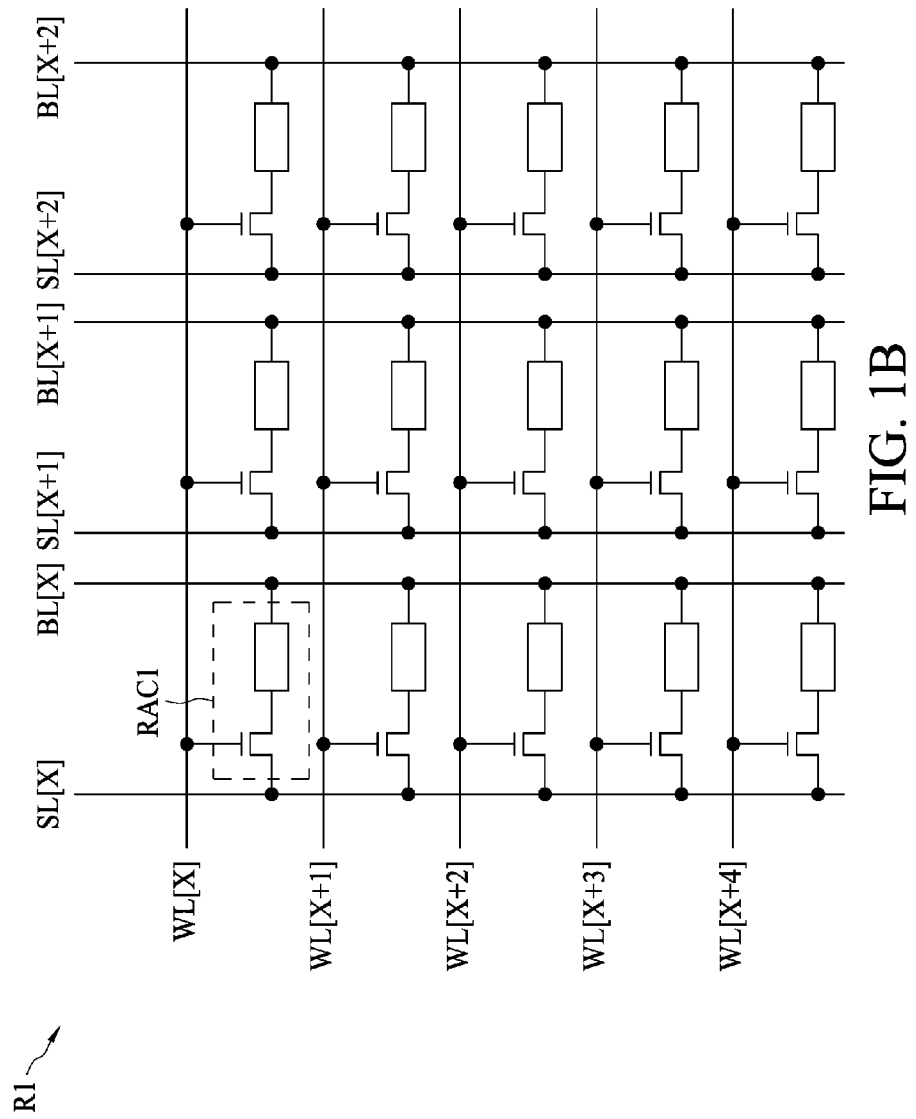
FIG. 1B is a schematic diagram illustrating an array of memory cells of a memory device as shown in FIG. 1A.

FIG. 1B is a schematic diagram illustrating an array of memory cells R1 of a memory as shown in FIG. 1A.

Referring to FIG. 1B, the memory device R1 may contain an array of random access memory (RAM) cells RAC1 for storing data. For illustration, the memory device R1 includes a 3×5 array of RAM cells RAC1. In some embodiments, the array of RAM cells RAC1 may be expanded.

Figure 1C:
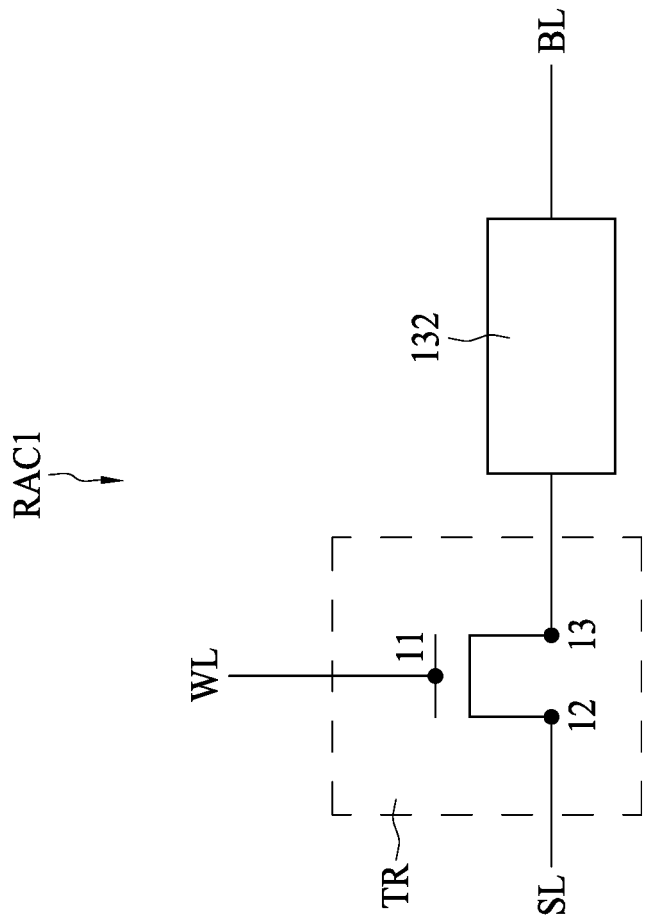
FIG. 1C is a schematic diagram illustrating one memory cell of the array as shown in FIG. 1B.

FIG. 1C is a schematic diagram illustrating one memory cell RAC1 of the array as shown in FIG. 1B.

Referring to FIG. 1C, the RAM cell RAC1 includes a transistor TR and a storage element 132. The transistor TR has a gate 11, source 12 and drain 13. One end of the storage element 132 electrically connects to a bit line BL, and the other end of the storage element 132 electrically connects to drain 13 of the transistor TR. Gate 11 of the transistor TR electrically connects to a word line WL and source 12 of the transistor TR electrically connects to a source line SL.

The storage element 132 may include volatile memory, for example, a RAM, which loses its data as soon as the semiconductor integrated circuit 1 is turned off. The storage element 132 may include a non-volatile memory. The storage element 132 may include one of resistive random access memory (RRAM), magnetoresistive random access memory (MRAM), ferroelectric random access memory (FeRAM), phase-change random access memory (PCRAM) and programmable conductive random access memory (PCRAM).

RRAM is an advantageous form of non-volatile memory, which has a low operating voltage, high-speed characteristics, and good endurance. A memory cell of an RRAM functions by determining a change in electrical resistance of a film, generally a metal oxide film. Moreover, the electrical resistance corresponds to the stored information (e.g. a value of "0" or "1"). An RRAM generally includes an array of such memory cells. A memory cell of the RRAM device includes a data storage element that has two electrodes and a variable resistive material layer interposed between the two electrodes. The variable resistive material layer (also known as the data storage layer, memory thin film, or resistive thin film) has a reversible variation in resistance according to the polarity and/or the magnitude of an electric signal (e.g. voltage or current) applied between the electrodes. The variable resistive material layer is typically formed of transition metal oxide.

An MRAM device includes an array of MRAM cells, each of which is implemented as a single-bit cell to store a binary data value. Each MRAM cell includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, for example, by applying a magnetic field.

When the respective magnetizations of the reference layer and the storage layer are antiparallel, the resistance of the magnetic tunnel junction is high, namely a high logic state "1". On the other hand, when the respective magnetizations are parallel, the resistance of the magnetic tunnel junction is low, namely a low logic state "0". A logic state of a MRAM cell is read by comparing its resistance value to a reference resistance value, which represents an in-between resistance value between that of the high logic state "1" and the low logic state "0".

A ferroelectric memory (FeRAM) is a non-volatile memory which utilizes a ferroelectric material, such as SBT or PZT, as the capacitor dielectric situated between a bottom electrode and a top electrode. Both read and write operations are performed for an FeRAM. The memory size and memory architecture affect the read and write access times of a FeRAM. The non-volatility of an FeRAM is due to the bi-stable characteristic of the ferroelectric memory cell. Two types of memory cells are used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell may be more stable than a 1C memory cell.

Resistance variable memory, which may refer to programmable conductive random access memory (PCRAM) or phase-change random access memory (PCRAM), has been investigated for suitability as semi-volatile and non-volatile random access memory devices. In a PCRAM device, the resistance of a chalcogenide glass backbone can be programmed to stable lower conductivity (i.e., higher resistance) and higher conductivity (i.e., lower resistance) states. An unprogrammed PCRAM device is normally in a lower conductivity or higher resistance state.

A conditioning operation forms a conducting channel of a metal-chalcogenide in the PCRAM device, which supports a conductive pathway for altering the conductivity/resistivity state of the device. The conducting channel remains in the glass backbone even after the device is erased. After the conditioning operation, a write operation will program the PCRAM device to a higher conductivity state, in which metal ions accumulate along the conducting channel(s). The PCRAM device may be read by applying a voltage of a lesser magnitude than required to program it. The current or resistance across the memory device is sensed as higher or lower to define the logic "one" and "zero" states. The PCRAM may be erased by applying a reverse voltage (opposite bias) relative to the write voltage, which disrupts the conductive pathway, but leaves the conducting channel intact. By this way, such a device can function as a variable resistance memory having at least two conductivity states, which can define two respective logic states, i.e., at least a bit of data.

Referring back to FIG. 1B, a source line SL[X] electrically connects to source 12 of each transistor TR of the left-most column of the RAM cells RAC1 of the memory device R1. A source line SL[X+1] electrically connects to source 12 of each transistor TR of the middle column of the RAM cells RAC1 of the memory device R1. A source line SL[X+2] electrically connects to source 12 of each transistor TR of the right-most of the RAM cells RAC1 of the memory device R1.

A bit line BL[X] electrically connects to each the storage element 132 of the left-most column of the RAM cells RAC1 of the memory device R1. A bit line BL[X+1] electrically connects to each the storage element 132 of the middle column of the RAM cells RAC1 of the memory device R1. A bit line BL[X+2] electrically connects to each the storage element 132 of the right-most column of the RAM cells RAC1 of the memory device R1.

A word line WL[X] electrically connects to gate 11 of each transistor TR of a row of the RAM cells RAC1 of the memory device R1. A word line WL[X+1] electrically connects to gate 11 of each transistor TR of another row of the RAM cells RAC1 of the memory device R1. A word line WL[X+2] electrically connects to gate 11 of each transistor TR of another row of the RAM cells RAC1 of the memory device R1. A word line WL[X+3] electrically connects to gate 11 of each transistor TR of another row of the RAM cells RAC1 of the memory device R1. A word line WL[X+4] electrically connects to gate 11 of each transistor TR of another row of the RAM cells RAC1 of the memory device R1.

Figure 1D:
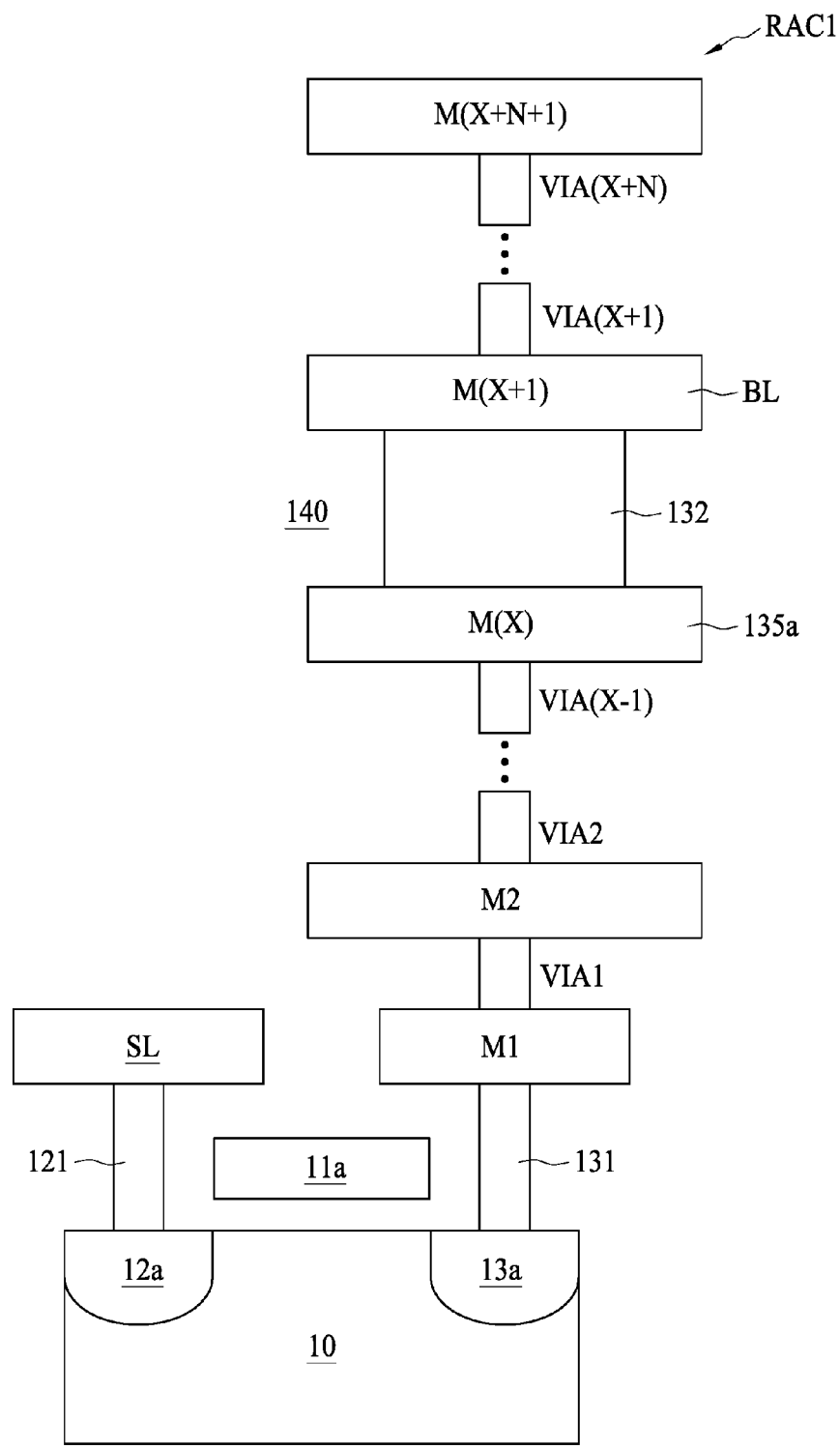
FIG. 1D is a schematic diagram illustrating a semiconductor structure of the memory cell as shown in FIG. 1C.

FIG. 1D is a schematic diagram illustrating a semiconductor structure of the memory cell as shown in FIG. 1C.

Referring to FIG. 1D, the RAM cells RAC1 of the memory device R1 is formed on a substrate 10. The array of RAM cells RAC1, peripheral devices P1, peripheral circuits P2 and other circuits O1 are disposed on the substrate 10.

Adjacent devices or rows or columns of devices are electrically isolated by trenches (not shown in FIG. 1D) formed within the substrate 10, which are subsequently filled with dielectric material, and are commonly referred to as trench isolation.

The semiconductor substrate 10 includes but is not limited to, for example, a silicon substrate. A number of trench isolation regions (not shown in FIG. 1D) are formed in the semiconductor substrate 10. The trench isolation regions, which may be formed of suitable dielectric materials, may be provided to isolate a transistor, which includes gate 11a, source 12a and drain 13a, and is electrically isolated from neighboring semiconductor devices such as other transistors (not shown in FIG. 1D). The trench isolation regions may, for example, include an oxide (e.g., Ge oxide), an oxynitride (e.g., GaP oxynitride), silicon dioxide (SiO2), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The trench isolation regions may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the trench isolation regions may be formed of any suitable "low dielectric constant" or "low K" dielectric material, where K is less than or equal to about 4.

Gate 11a of the transistor is formed over the substrate while source 12a and drain 13a of the transistor are formed in the substrate 10. Gate 11a of the transistor electrically connects to a word line (not shown in FIG. 1D).

Source 12a of the transistor electrically connects to a source line SL formed over the substrate 10 by a conductive post 121. The conductive post 121 may include but is not limited to copper, tungsten or another suitable metal or alloy. The source line SL and the conductive post 121 may be formed by, for example, photolithographic and plating techniques.

A number of patterned conductive layers M1, M2 ... M(X), M(X+1) ... M(X+N+1) are formed over the substrate 10. The patterned conductive layers M1, M2 ... M(X), M(X+1) ... M(X+N+1) are formed over the drain 13a of the transistor. A dielectric structure 140 is formed on the substrate 10. The dielectric structure 140 may be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the dielectric structure 140 may be formed of any suitable "low dielectric constant" or "low K" dielectric material, where K is less than or equal to about 4. The patterned conductive layer M(X) may include a number of portions 135a, 135b (not shown in FIG. 1D) and 135c (not shown in FIG. 1D). The portions 135a, 135b and 135c are separated and isolated from one another. The patterned conductive layer M(X+1) may include a bit line BL or electrically connect to the bit line BL.

The drain 13a in the substrate 10 is electrically connected to the patterned conductive layer M1 by a conductive post 131. The conductive post 131 and the patterned conductive layers M1, M2 ... M(X), M(X+1) ... M(X+N+1) may include but is not limited to tungsten, copper or another suitable metal or alloy.

A number of vias VIA1, VIA2 ... VIA (X−1) are formed in the dielectric structure 140 to electrically connect the patterned conductive layers M1, M2 ... M(X). A number of vias VIA(X+1) ... VIA (X+N) are formed in the dielectric structure 140 to electrically connect the patterned conductive layers M(X+1) ... M(X+N+1). The vias VIA1, VIA2 ... VIA (X−1), VIA(X+1) ... VIA (X+N) may include but are not limited to copper, tungsten or another suitable metal or alloy.

The storage element 132 is disposed or formed between the portion 135a of the patterned conductive layer M(X) and the patterned conductive layer M(X+1).

Figure 2A:
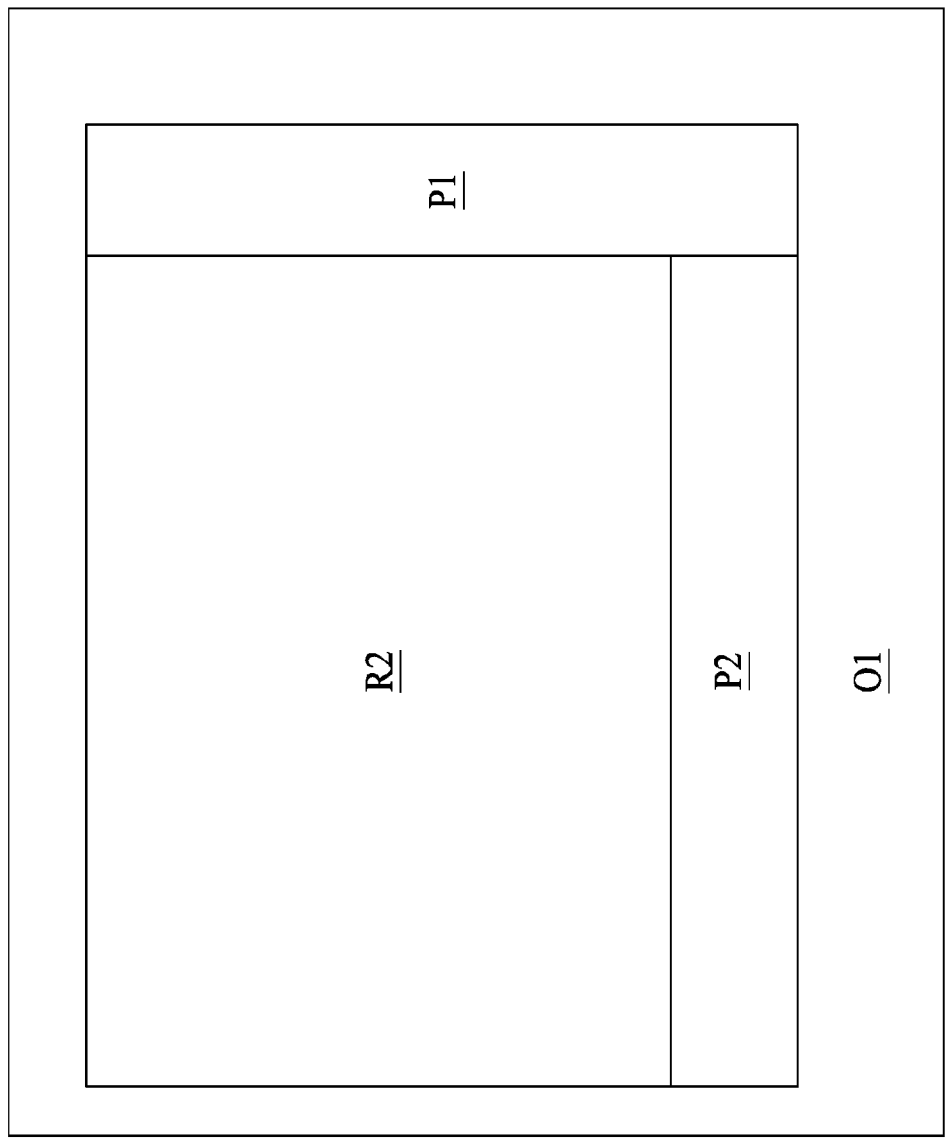
FIG. 2A is a block diagram illustrating another integrated circuit in accordance with some embodiments.

FIG. 2A is a block diagram illustrating another integrated circuit in accordance with some embodiments.

Referring to FIG. 2A, a semiconductor integrated circuit 2 includes a memory device R2, peripheral devices P1, peripheral circuits P2 and other circuits O1.

The semiconductor integrated circuit 2 may include, for example, a processor, a microprocessor or the like, which functions to control one or more peripheral devices P1 such as a disk drive or the like.

The memory device R2 serves as internal storage in the semiconductor integrated circuit 2. The memory device R2 may contain an array of memory cells for storing data. Moreover, row and column decoder circuits (P2) are coupled to the array of memory cells for accessing the memory cells in response to an external address. The memory device R2 may include a RAM and read-only memory (ROM).

Figure 2B:
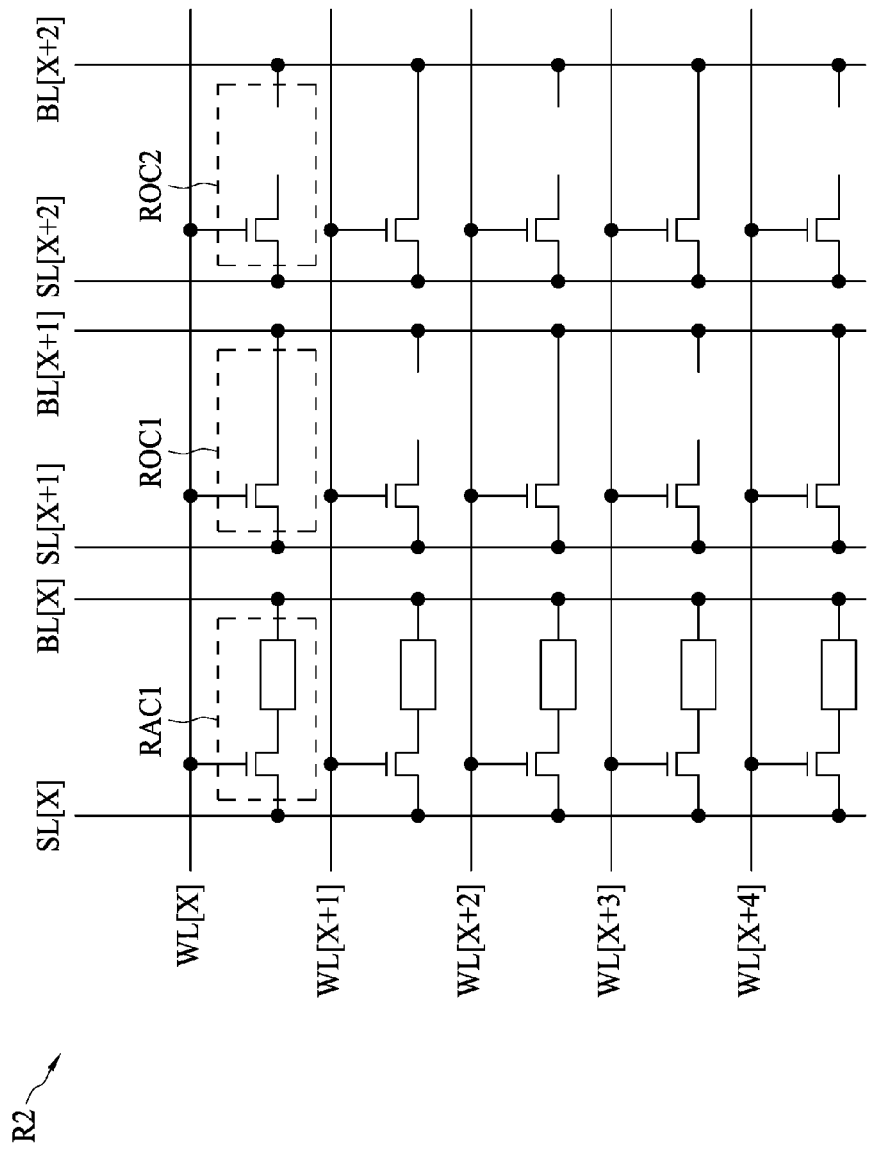
FIG. 2B is a schematic diagram illustrating an array of memory cells of a memory device as shown in FIG. 2A.

FIG. 2B is a schematic diagram illustrating an array of memory cells of a memory device as shown in FIG. 2A.

Referring to FIG. 2B, the memory device R2 contains an array of RAM cells RAC1, ROM cells ROC1 and ROM cells ROC2 for storing data. For illustration, the memory device R2 is a 3×5 array of memory cells RAC1, ROC1 and ROC2. In some embodiments, the array of random access memory cells RAC1, ROC1 and ROC2 may be expanded.

Figure 2C:
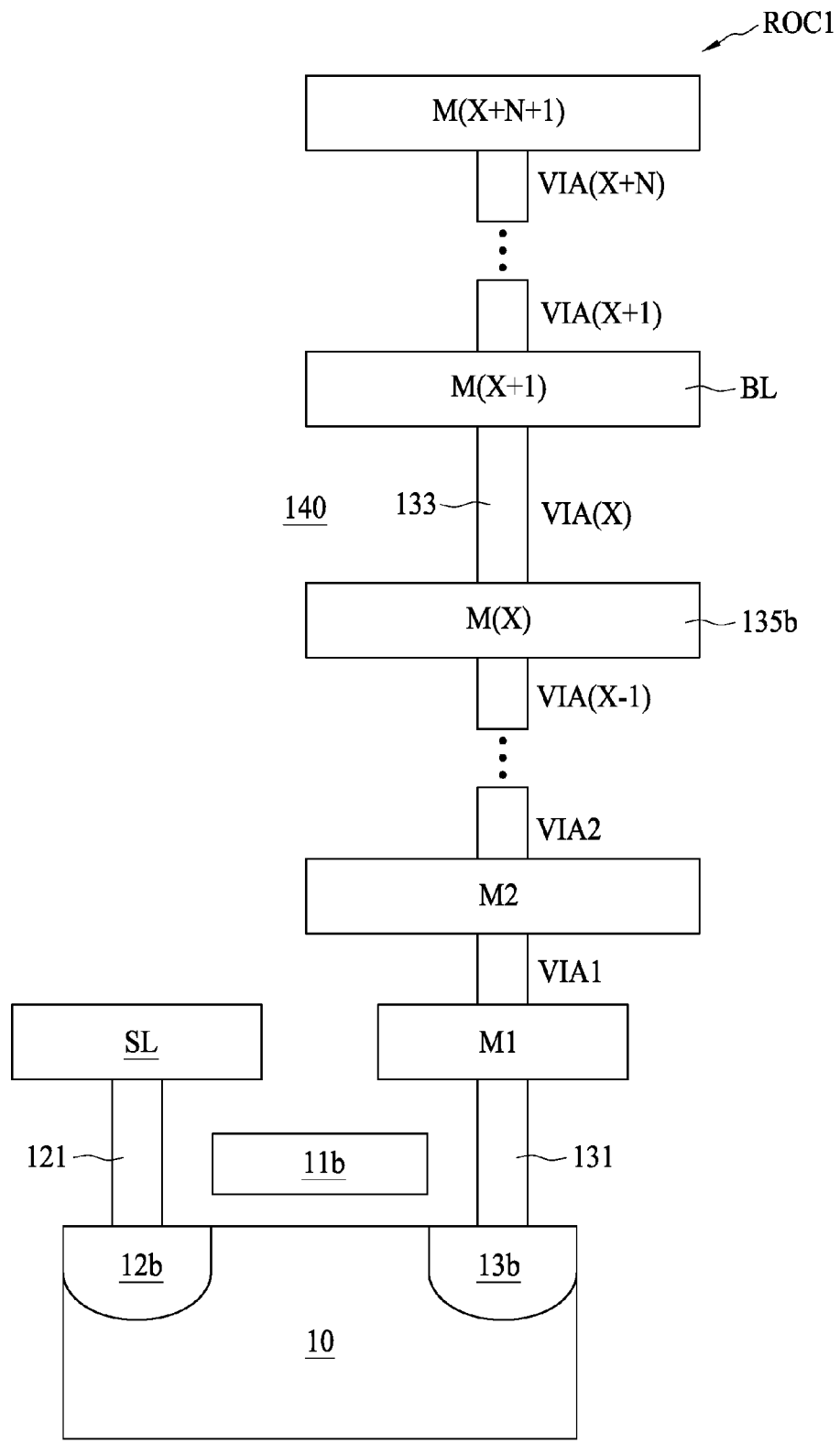
FIG. 2C is a schematic diagram illustrating a semiconductor structure of a memory cell as shown in FIG. 2B in accordance with some embodiments.

FIG. 2C is a schematic diagram illustrating a semiconductor structure of a memory cell as shown in FIG. 2B in accordance with some embodiments.

Referring to FIG. 2C, the ROM cells ROC1 of the memory device R2 are formed on a substrate 10. The array of RAM cells RAC1, ROM cells ROC1 and ROM cells ROC2, peripheral devices P1, peripheral circuits P2 and other circuits O1 are disposed on the substrate 10.

Adjacent devices or rows or columns of devices are electrically isolated by trench isolation regions (not shown in FIG. 2C) formed within the substrate 10.

The semiconductor substrate 10 includes but is not limited to, for example, a silicon substrate. A number of trench isolation regions (not shown in FIG. 2C) are formed in the semiconductor substrate 10. The trench isolation regions, which may be formed of suitable dielectric materials, are provided to isolate a transistor, which includes gate 11b, source 12b and drain 13b, and is electrically isolated from neighboring semiconductor devices such as other transistors (as shown in FIG. 1D).

Gate 11b of the transistor is formed over the substrate while source 12b and drain 13b of the transistor are formed in the substrate 10. Gate 11a of the transistor electrically connects to a word line (not shown in FIG. 2C).

Source 12b of the transistor electrically connects to a source line SL formed over the substrate 10 by a conductive post 121. The conductive post 121 may include but is not limited to tungsten, copper or another suitable metal or alloy. The source line SL and the conductive post 121 may be formed by, for example, photolithographic and plating techniques.

A number of patterned conductive layers M1, M2 . . . M(X), M(X+1) . . . M(X+N+1) are formed over the substrate 10. The patterned conductive layers M1, M2 . . . M(X), M(X+1) . . . M(X+N+1) are formed over the drain 13b of the transistor. A dielectric structure 140 is formed on the substrate 10. The dielectric structure 140 may be formed of any suitable "high dielectric constant" or "high K" material, where K is greater than or equal to about 8. Alternatively, the dielectric structure 140 may be formed of any suitable "low dielectric constant" or "low K" dielectric material, where K is less than or equal to about 4. The patterned conductive layer M(X) may include a number of portions 135a (not shown in FIG. 2C), 135b and 135c (not shown in FIG. 2C). The portions 135a, 135b and 135c are separated and isolated from one another. The patterned conductive layer M(X+1) may include a bit line BL or electrically connect to the bit line BL.

The drain 13b in the substrate 10 is electrically connected to the patterned conductive layer M1 by a conductive post 131. The conductive post 131 and the patterned conductive layers M1, M2 . . . M(X), M(X+1) . . . M(X+N+1) may include but are not limited to tungsten, copper or another suitable metal or alloy.

A number of vias VIA1, VIA2 . . . VIA (X−1) are formed in the dielectric structure 140 to electrically connect the patterned conductive layers M1, M2 . . . M(X). A number of vias VIA(X+1) . . . VIA (X+N) are formed in the dielectric structure 140 to electrically connect the patterned conductive layers M(X+1) . . . M(X+N+1). The vias VIA1, VIA2 . . . VIA (X−1), VIA(X+1) . . . VIA (X+N) may include but are not limited to copper, tungsten or another suitable metal or alloy.

A via VIA(X) or conductive post 133 is disposed or formed between the portion 135b of the patterned conductive layer M(X) and the patterned conductive layer M(X+1). The via VIA(X) or conductive post 133 electrically connects the portion 135b of the patterned conductive layer M(X) to the patterned conductive layer M(X+1). The via VIA(X) or conductive post 133 may include but is not limited to copper, tungsten or another suitable metal or alloy. With the via VIA(X) or conductive post 133 which electrically connects the portion 135b of the patterned conductive layer M(X) to the patterned conductive layer M(X+1), the ROM cell ROC1 may retain or store a high logic state "1" signal.

Figure 2D:
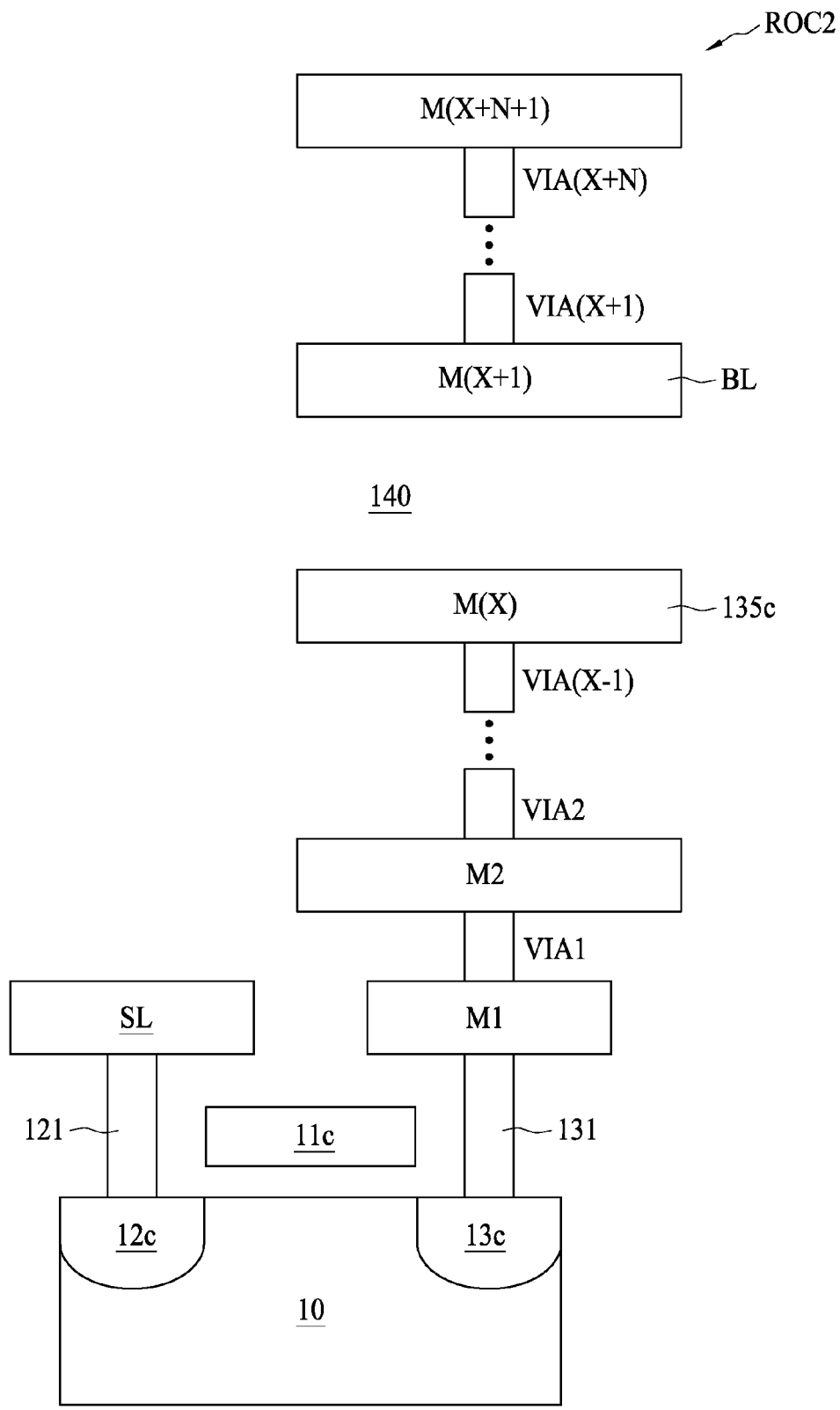
FIG. 2D is a schematic diagram illustrating another semiconductor structure of a memory cell as shown in FIG. 2B in accordance with some embodiments.

FIG. 2D is a schematic diagram illustrating another semiconductor structure of a memory cell as shown in FIG. 2B in accordance with some embodiments.

Referring to FIG. 2D, the ROM cells ROC2 of the memory device R2 are formed on a substrate 10.

Adjacent devices or rows or columns of devices are electrically isolated by trench isolations (not shown in FIG. 2D) formed within the substrate 10.

The semiconductor substrate 10 includes but is not limited to, for example, a silicon substrate. A number of trench isolation regions (not shown in FIG. 2D) are formed in the semiconductor substrate 10. The trench isolation regions, which may be formed of suitable dielectric materials, are provided to isolate a transistor, which includes gate 11c, source 12c and drain 13c, and is electrically isolated from neighboring semiconductor devices such as other transistors (as shown in FIGS. 1D and 2C).

Gate 11c of the transistor is formed over the substrate while source 12c and drain 13c of the transistor are formed in the substrate 10. Gate 11c of the transistor electrically connects to a word line (not shown in FIG. 2D).

Source 12c of the transistor electrically connects to a source line SL formed over the substrate 10 by a conductive post 121. The conductive post 121 may include but is not limited to copper, tungsten or another suitable metal or alloy. The source line SL and the conductive post 121 may be formed by, for example, photolithographic and plating techniques.

A number of patterned conductive layers M1, M2 . . . M(X), M(X+1) . . . M(X+N+1) are formed over the substrate 10. The patterned conductive layers M1, M2 . . . M(X), M(X+1) . . . M(X+N+1) are formed over the drain 13c of the transistor. A dielectric structure 140 is formed on the substrate 10. The dielectric structure 140 may be formed of any suitable "high dielectric constant" or "high K" material, where K is greater than or equal to about 8. Alternatively, the dielectric structure 140 may be formed of any suitable "low dielectric constant" or "low K" dielectric material, where K is less than or equal to about 4. The patterned conductive layer M(X) may include a number of portions 135a (not shown in FIG. 2D), 135b (not shown in FIG. 2D) and 135c. The portions 135a, 135b and 135c are separated and isolated from one another. The patterned conductive layer M(X+1) may include a bit line BL or electrically connect to the bit line BL.

The drain 13c of the substrate 10 is electrically connected to the patterned conductive layer M1 by a conductive post 131. The conductive post 131 and the patterned conductive layers M1, M2 . . . M(X), M(X+1) . . . M(X+N+1) may include but are not limited to copper, tungsten or another suitable metal or alloy.

A number of vias VIA1, VIA2 . . . VIA (X−1) are formed in the dielectric structure 140 to electrically connect the patterned conductive layers M1, M2 . . . M(X).

A number of vias VIA(X+1) . . . VIA (X+N) are formed in the dielectric structure 140 to electrically connect the patterned conductive layers M(X+1) . . . M(X+N+1). The vias VIA1, VIA2 . . . VIA (X−1), VIA(X+1) . . . VIA (X+N) may include but are not limited to copper, tungsten or another suitable metal or alloy.

The portion 135c of the patterned conductive layer M(X) is separated or isolated from the patterned conductive layer M(X+1). The portion 135c of the patterned conductive layer M(X) is separated or isolated from the patterned conductive layer M(X+1) by the dielectric structure 140. The portion 135c of the patterned conductive layer M(X) is separated or isolated from the patterned conductive layer M(X+1) such that the ROM cell ROC2 may retain or store a low logic state "0" signal.

Figure 2E:
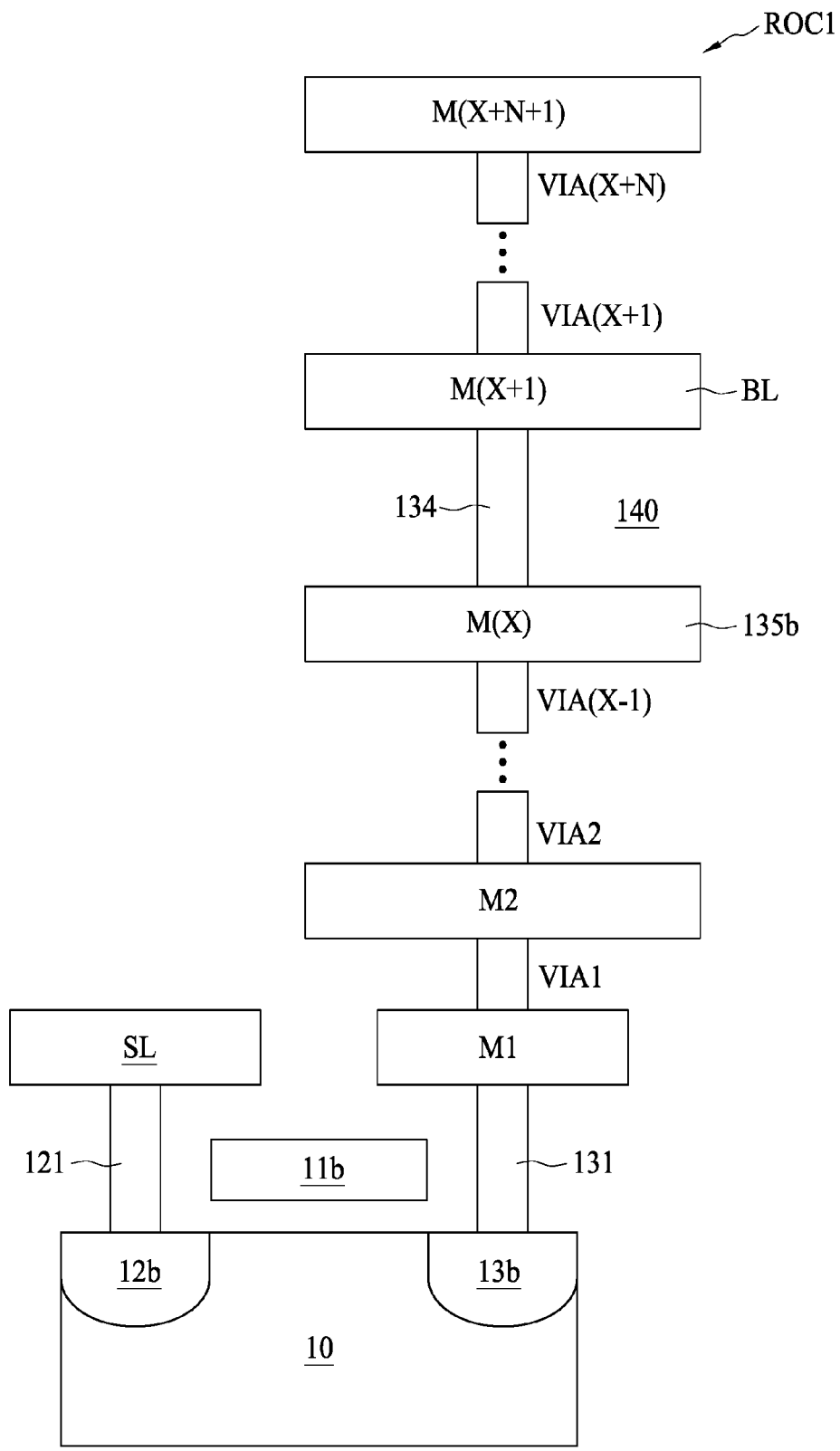
FIG. 2E is a schematic diagram illustrating another semiconductor structure of a memory cell as shown in FIG. 2B in accordance with some embodiments.

FIG. 2E is a schematic diagram illustrating another semiconductor structure of a memory cell as shown in FIG. 2B in accordance with some embodiments.

Referring to FIG. 2E, the semiconductor structure is similar to that described and illustrated with reference to FIG. 2C except that, for example, a fusible device 134 replaces the via VIA(X) or conductive post 133 in FIG. 2C. The fusible device 134 is disposed or formed between the portion 135b of the patterned conductive layer M(X) and the patterned conductive layer M(X+1). The fusible device 134 electrically connects the portion 135b of the patterned conductive layer M(X) to the patterned conductive layer M(X+1). The fusible device 134 may include but is not limited to low resistance material. The fusible device 134 functions to blow, melt or fuse when a relatively large current flows through it. With the fusible device 134, which electrically connects the portion 135b of the patterned conductive layer M(X) to the patterned conductive layer M(X+1), the read-only memory (ROM) cell ROC1 may retain or store a high logic state "1" signal.

Figure 2F:
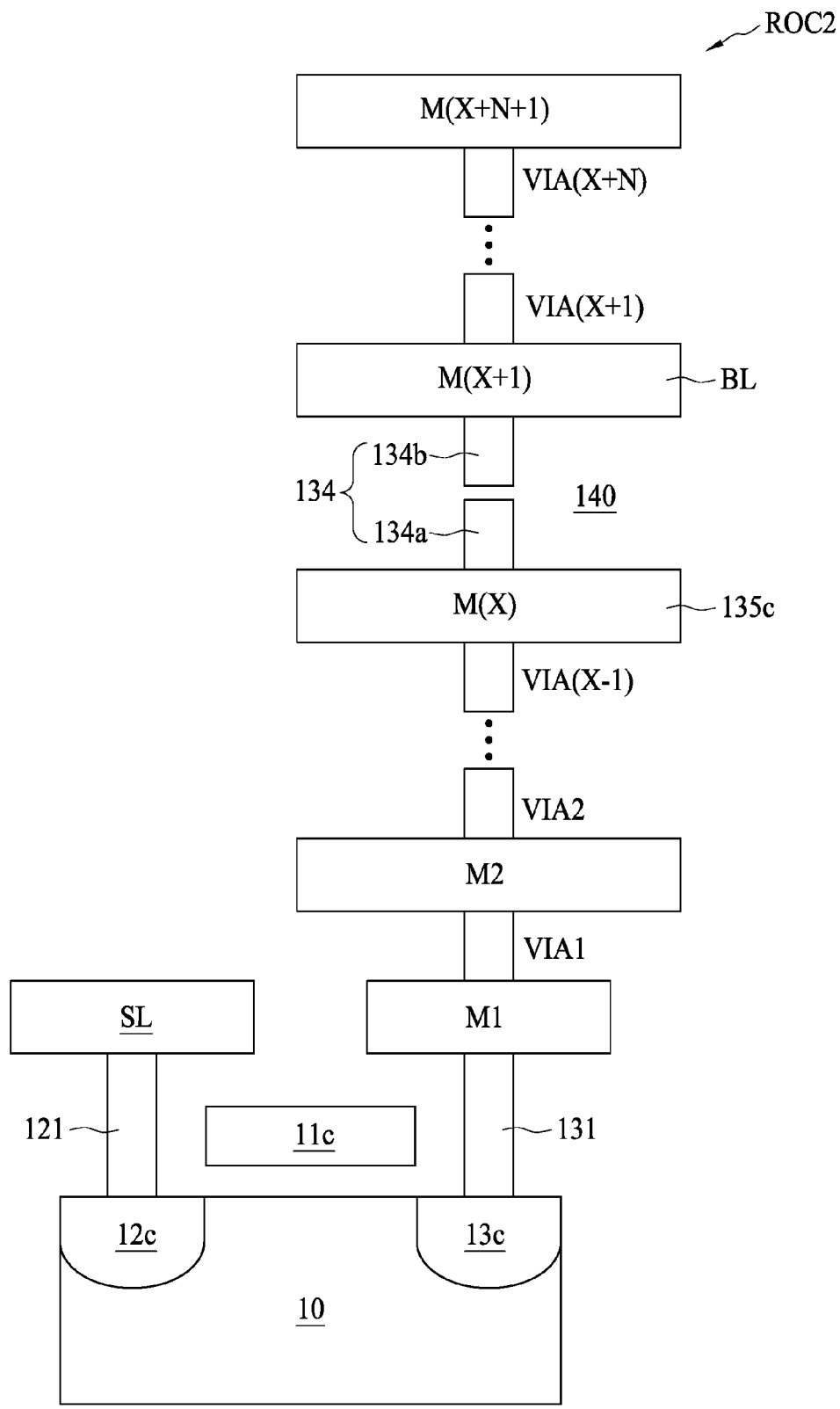
FIG. 2F is a schematic diagram illustrating another semiconductor structure of a memory cell as shown in FIG. 2B in accordance with some embodiments.

FIG. 2F is a schematic diagram illustrating another semiconductor structure of a memory cell as shown in FIG. 2B in accordance with some embodiments.

Referring to FIG. 2F, the semiconductor structure is similar to that described and illustrated with reference to FIG. 2D except that, for example, a fusible device 134 is blown, fused or melted. As a result, a remnant 134a of the blown, fused or melted fusible device 134 is on the portion 135c of the patterned conductive layer M(X), while a remnant 134b of the blown, fused or melted fusible device 134 is on the patterned conductive layer M(X+1). The portion 135c of the patterned conductive layer M(X) is separated or isolated from the patterned conductive layer M(X+1) by the dielectric structure 140. The remnant 134a and the remnant 134b are separated or isolated by the dielectric structure 140. The portion 135c of the patterned conductive layer M(X) is separated or isolated from the patterned conductive layer M(X+1) such that the ROM cell ROC2 may retain or store a low logic state "0" signal.

Figure 2G:
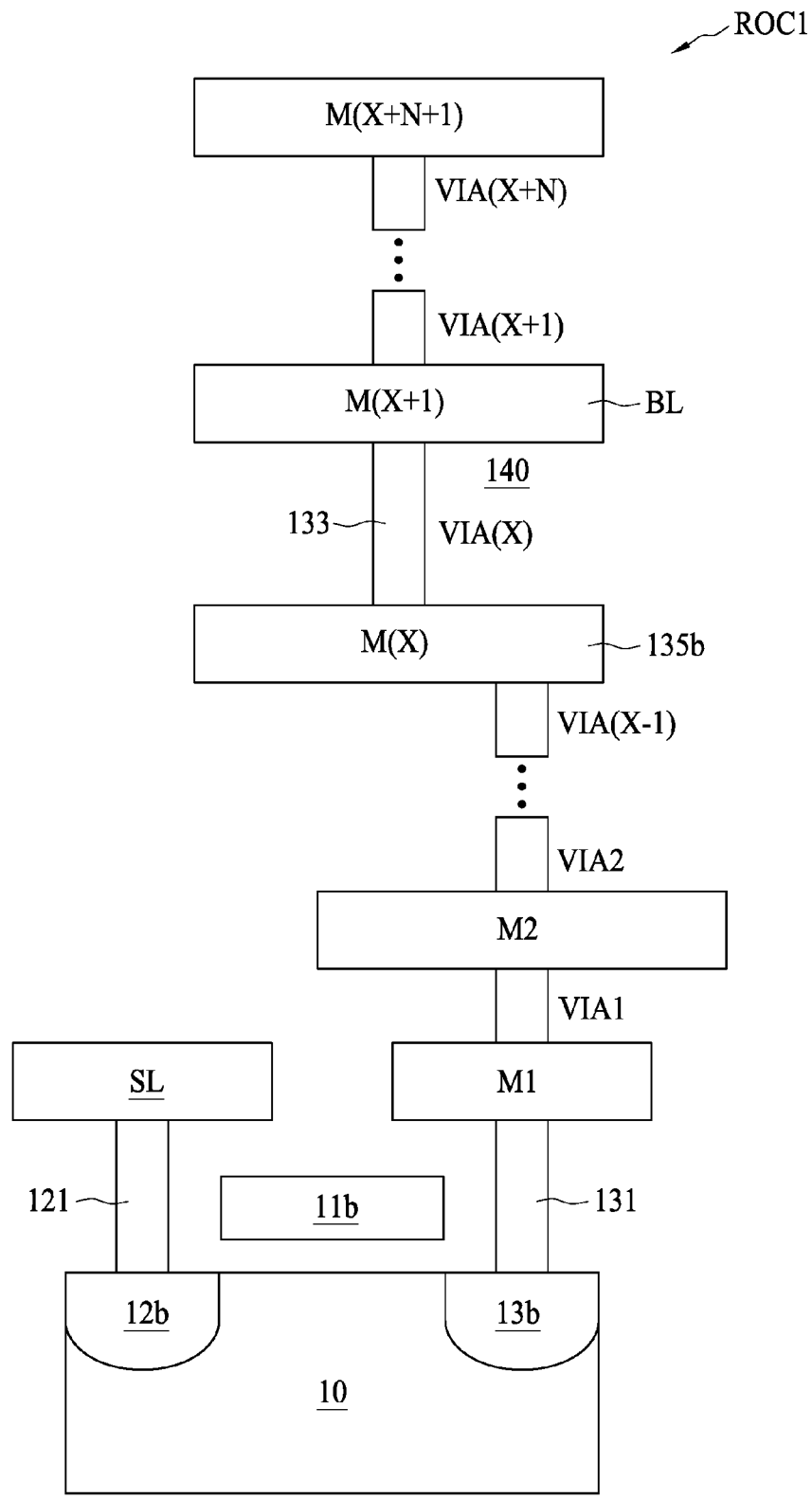
FIG. 2G is a schematic diagram illustrating another semiconductor structure of a memory cell as shown in FIG. 2B in accordance with some embodiments.

FIG. 2G is a schematic diagram illustrating another semiconductor structure of a memory cell as shown in FIG. 2B in accordance with some embodiments.

Referring to FIG. 2G, the semiconductor structure is similar to that described and illustrated with reference to FIG. 2C except that, for example, the patterned conductive layers M1, M2 . . . M(X−1) are not aligned with the patterned conductive layers M(X+1) . . . M(X+N+1), and the vias VIA1, VIA2 . . . VIA (X−1) are not aligned with the vias VIA(X), VIA(X+1) . . . VIA (X+N).

A via VIA(X) or conductive post 133 is disposed or formed between the portion 135b of the patterned conductive layer M(X) and the patterned conductive layer M(X+1). The via VIA(X) or conductive post 133 electrically connects the portion 135b of the patterned conductive layer M(X) to the patterned conductive layer M(X+1). With the via VIA(X) or conductive post 133 which electrically connects the portion 135b of the patterned conductive layer M(X) to the patterned conductive layer M(X+1), the ROM cell ROC1 may retain or store a high logic state "1" signal.

Figure 2H:
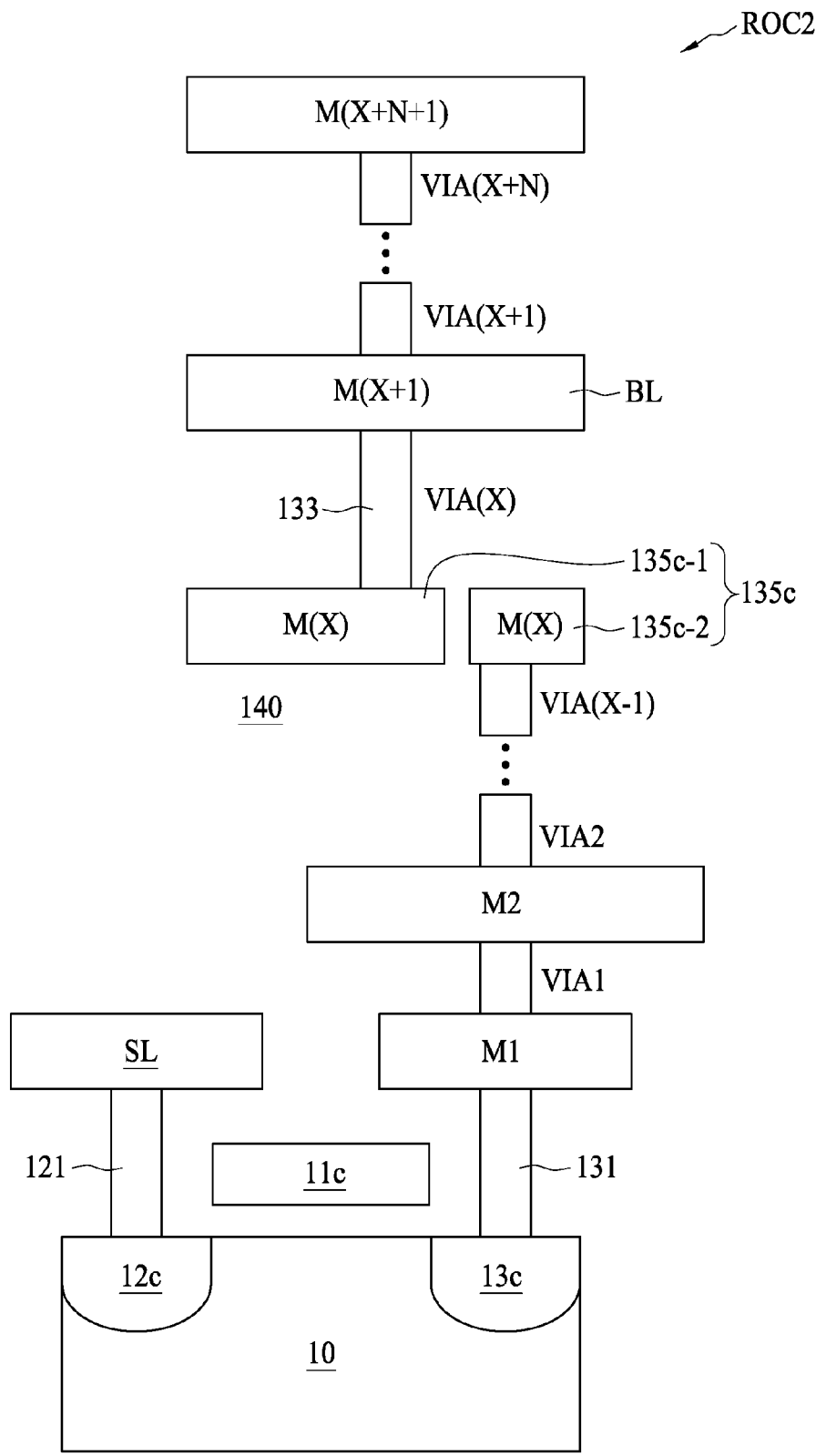
FIG. 2H is a schematic diagram illustrating another semiconductor structure of a memory cell as shown in FIG. 2B in accordance with some embodiments.

FIG. 2H is a schematic diagram illustrating another semiconductor structure of a memory cell as shown in FIG. 2B in accordance with some embodiments.

Referring to FIG. 2H, the semiconductor structure is similar to that described and illustrated with reference to FIG. 2G except that, for example, the portion 135c of the patterned conductive layer M(X) includes two sections 135c-1 and 135c-2. The section 135c-1 is separated or isolated from the section 135c-2.

A via VIA(X) or conductive post 133 is disposed or formed between the section 135c-1 of the patterned conductive layer M(X) and the patterned conductive layer M(X+1). The via VIA(X) or conductive post 133 electrically connects the section 135c-1 of the patterned conductive layer M(X) to the patterned conductive layer M(X+1).

The section 135c-1 of the patterned conductive layer M(X) is separated or isolated from the section 135c-2 by the dielectric structure 140. The section 135c-1 of the patterned conductive layer M(X) is separated or isolated from the section 135c-2 such that the ROM cell ROC2 may retain or store a low logic state "0" signal.

Figure 2I:
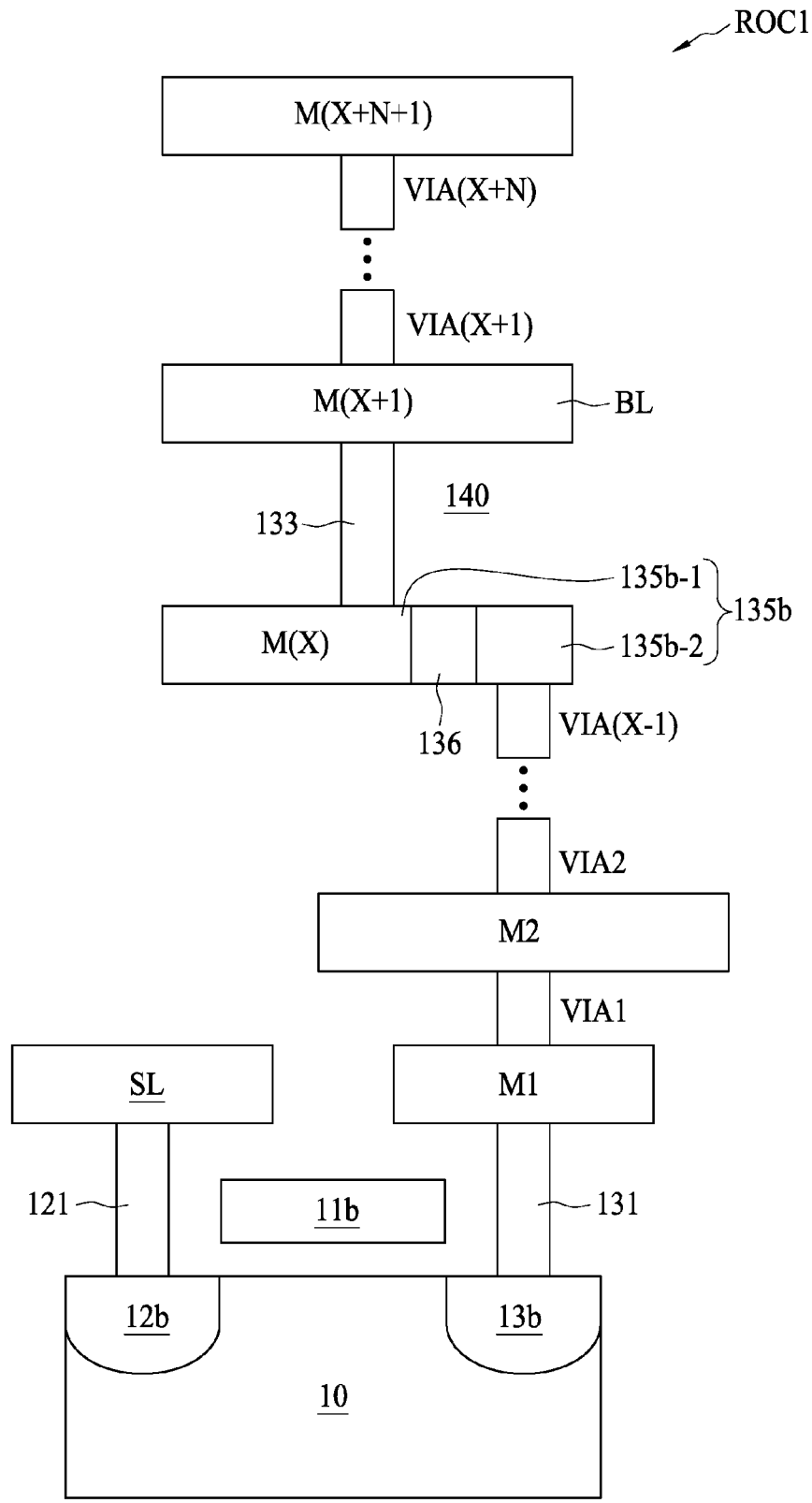
FIG. 2I is a schematic diagram illustrating another semiconductor structure of a memory cell as shown in FIG. 2B in accordance with some embodiments.

FIG. 2I is a schematic diagram illustrating another semiconductor structure of a memory cell as shown in FIG. 2B in accordance with some embodiments.

Referring to FIG. 2I, the semiconductor structure is similar to that described and illustrated with reference to FIG. 2G except that, for example, the portion 135b includes two sections 135b-1 and 135b-2. The section 135b-1 is separated from the section 135b-2. The portion 135b includes a fusible device 136 between sections 135b-1 and 135b-2. The section 135b-1 is separated from the section 135b-2 by the fusible device 136. The section 135b-1 is electrically connected to the section 1356b-2 by the fusible device 136. The fusible device 136 may include but is not limited to low resistance material. The fusible device 136 may blow, melt or fuse when a relatively large current flow through it.

A via VIA(X) or conductive post 133 is disposed or formed between the section 135b-1 of the portion 135b of the patterned conductive layer M(X) and the patterned conductive layer M(X+1). The via VIA(X) or conductive post 133 electrically connects the section 135b-1 of the portion 135b of the patterned conductive layer M(X) to the patterned conductive layer M(X+1). With the via VIA(X) or conductive post 133 which electrically connects the section 135b-1 of the portion 135b of the patterned conductive layer M(X) to the patterned conductive layer M(X+1), and the fusible device 136 which electrically connects the section 135b-1 to the section 135b-2, the ROM cell ROC1 may retain or store a high logic state "1" signal.

Figure 2J:
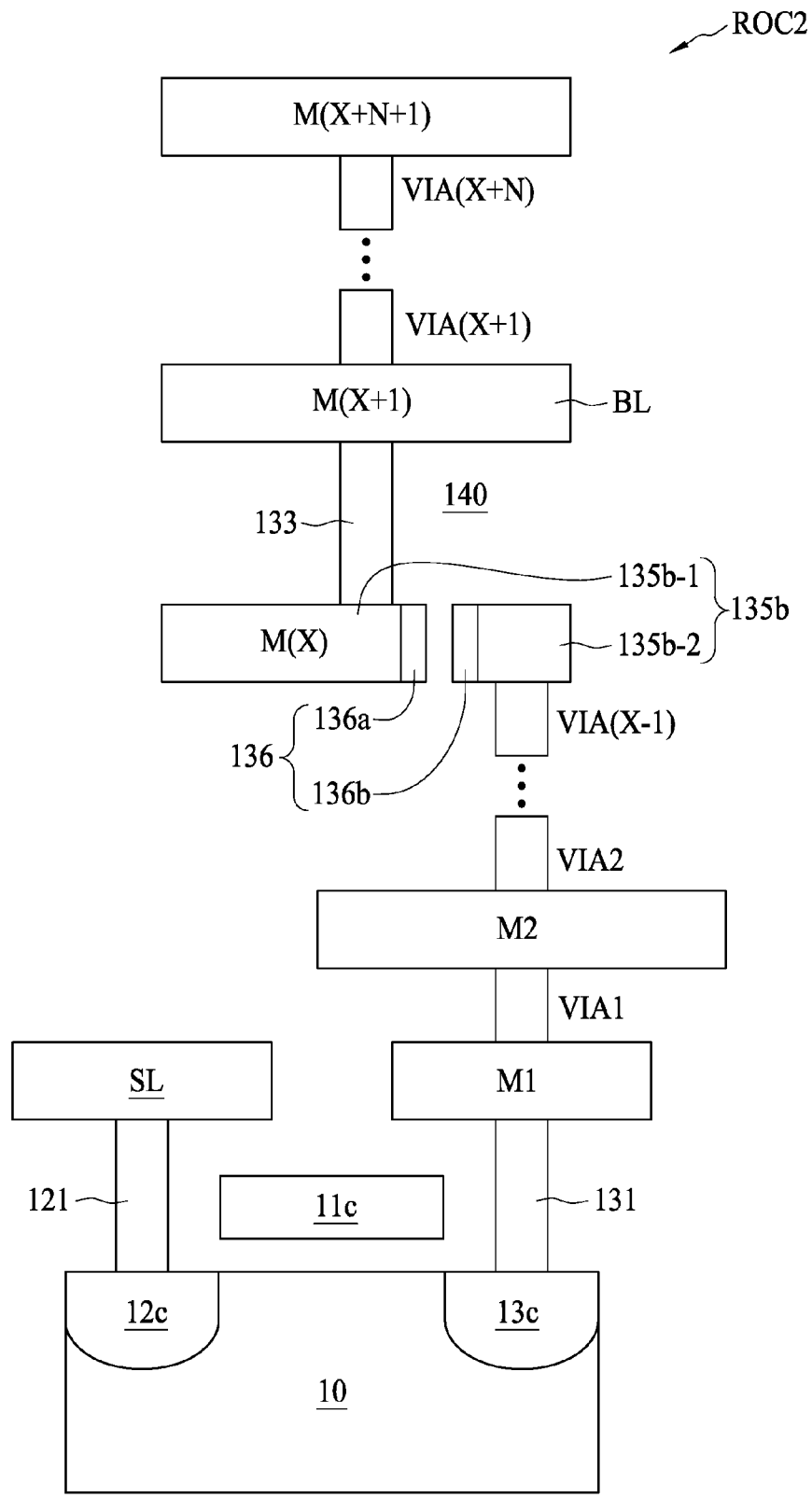
FIG. 2J is a schematic diagram illustrating another semiconductor structure of a memory cell as shown in FIG. 2B in accordance with some embodiments.

FIG. 2J is a schematic diagram illustrating another semiconductor structure of a memory cell as shown in FIG. 2B in accordance with some embodiments.

Referring to FIG. 2J, the semiconductor structure is similar to that described and illustrated with reference to FIG. 2I except that, for example, a fusible device 136 is blown, fused or melted. As a result, a residual 136a of a blown, fused or melted fusible device 136 is left on a side of the section 135c-1 of the patterned conductive layer M(X), while another residual 136b of the blown, fused or melted fusible device 136 is left on a side of the section 135c-2 of the patterned conductive layer M(X). The residuals 136a and 136b are separated by the dielectric structure 140. The section 135c-1 of the patterned conductive layer M(X) is separated or isolated from the section 135c-2 by the dielectric structure 140. The section 135c-1 of the patterned conductive layer M(X) is separated or isolated from the section 135c-2 such that the ROM cell ROC2 may retain or store a low logic state "0" signal.

Referring back to FIG. 2B, a source line SL[X] electrically connects to source 12 of each transistor TR of the left-most column of the RAM cells RAC1 of the memory device R2. A source line SL[X+1] electrically connects to source 12 of each transistor TR of a column of the ROM cells ROC1 and the ROM cells ROC2 of the memory device R2. A source line SL[X+2] electrically connects to source 12 of each transistor TR of another column of the ROM cells ROC1 and the ROM cells ROC2 of the memory device R2.

Moreover, a bit line BL[X] electrically connects to the drain of each transistor TR of a column of the RAM cells RAC1 of the memory device R2. A bit line BL[X+1] electrically connects to the drain of each transistor TR of a column of the ROM cells ROC1 and the ROM cells ROC2 of the memory device R2. A bit line BL[X+2] electrically connects to the drain of each transistor TR of another column of the ROM cells ROC1 and the ROM cells ROC2 of the memory device R2.

Furthermore, a word line WL[X] electrically connects to gate 11 of each transistor TR of a row of the ROM cells ROC1, the ROM cells ROC2 and the RAM cells RAC1 of the memory device R2. A word line WL[X+1] electrically connects to gate 11 of each transistor TR of another row of the ROM cells ROC1, the ROM cells ROC2 and the RAM cells RAC1 of the memory device R2. A word line WL[X+2] electrically connects to gate 11 of each transistor TR of another row of the ROM cells ROC1, the ROM cells ROC2 and the RAM cells RAC1 of the memory device R2. A word line WL[X+3] electrically connects to gate 11 of each transistor TR of another row of the ROM cells ROC1, the ROM cells ROC2 and the RAM cells RAC1 of the memory device R2. A word line WL[X+4] electrically connects to gate 11 of each transistor TR of another row of the ROM cells ROC1, the ROM cells ROC2 and the RAM cells RAC1 of the memory device R2.

The memory device R2 may include the RAM cells RAC1 as described and illustrated with reference to FIGS. 1C and 1D. The memory device R2 may include the ROM cells ROC1 as described and illustrated with reference to FIGS. 2C, 2E, 2G and 2I. The memory device R2 may include the ROM cells ROC2 as described and illustrated with reference to FIGS. 2D, 2F, 2H and 2J.

In the development stage of the integrated circuit 2, an application program may be stored in the memory device R2. Part of the application program to be secured may be stored in the ROM cells ROC1 and the ROM cells ROC2. Part of the application program, which may need to be verified, tested, or changed, may be stored in the RAM cells RAC1. Once the application program is finalized or completed, it can be stored in the ROM cells ROC1 and the ROM cells ROC2 to avoid undesired alteration. The configuration of the memory device R2 can be implemented in a given space (e.g. the same space occupied by the memory device R1 as shown in FIG. 1A) in the integrated circuit 2 and consumes no extra area. The configuration of the memory device R2 can be controled or accessed by the same peripheral circuits P2 as shown in FIG. 1A.

Figure 3A:
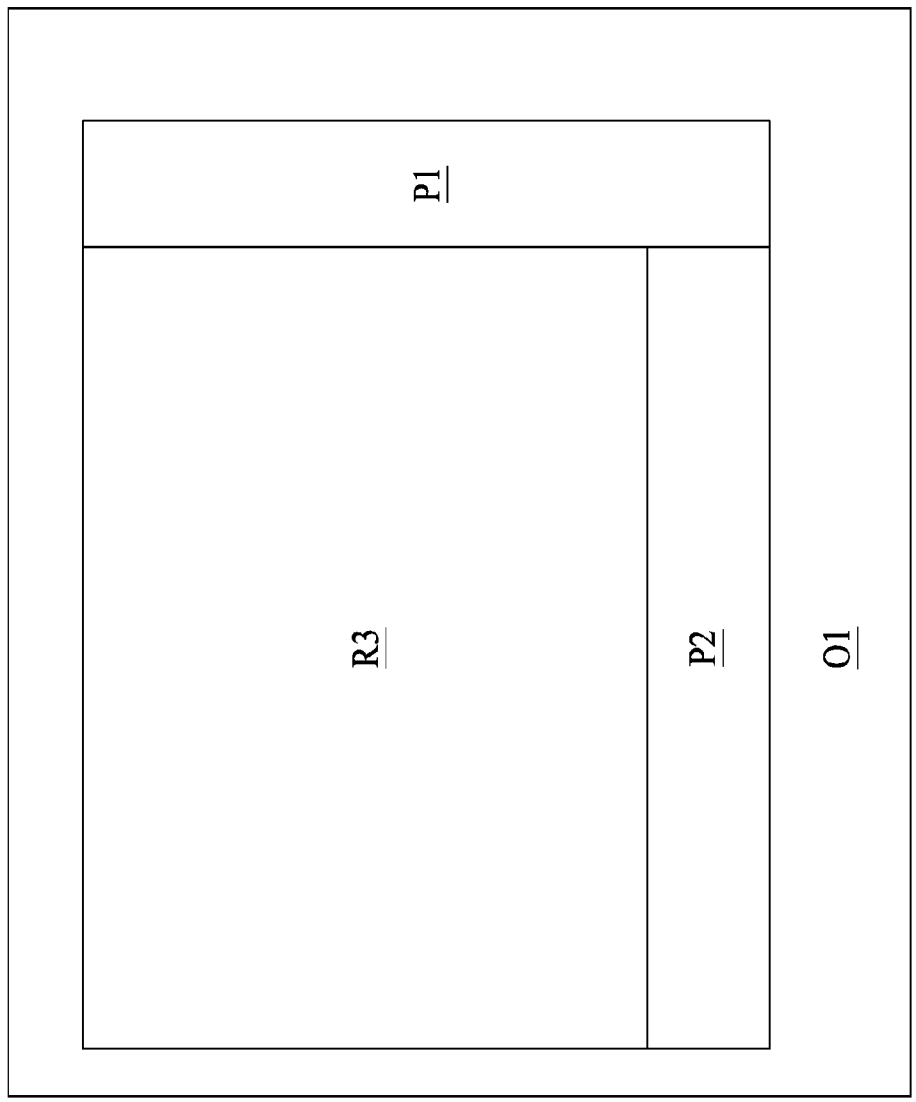
FIG. 3A is a block diagram illustrating another integrated circuit in accordance with some embodiments.

FIG. 3A is a block diagram illustrating another integrated circuit in accordance with some embodiments.

Referring to FIG. 3A, a semiconductor integrated circuit 3 includes a memory device R3, peripheral devices P1, peripheral circuits P2 and other circuits O1.

The semiconductor integrated circuit 3 may include, for example, a processor, a microprocessor or the like, which operates to control one or more peripheral devices P1 such as a disk drive or the like.

The memory device R3 may be provided as internal storage in the semiconductor integrated circuit 3. The memory device R3 may contain an array of memory cells for storing data, and row and column decoder circuits (P2) that are peripheral and coupled to the array of memory cells for accessing the memory cells in response to an external address. The memory device R3 may include a ROM.

Figure 3B:
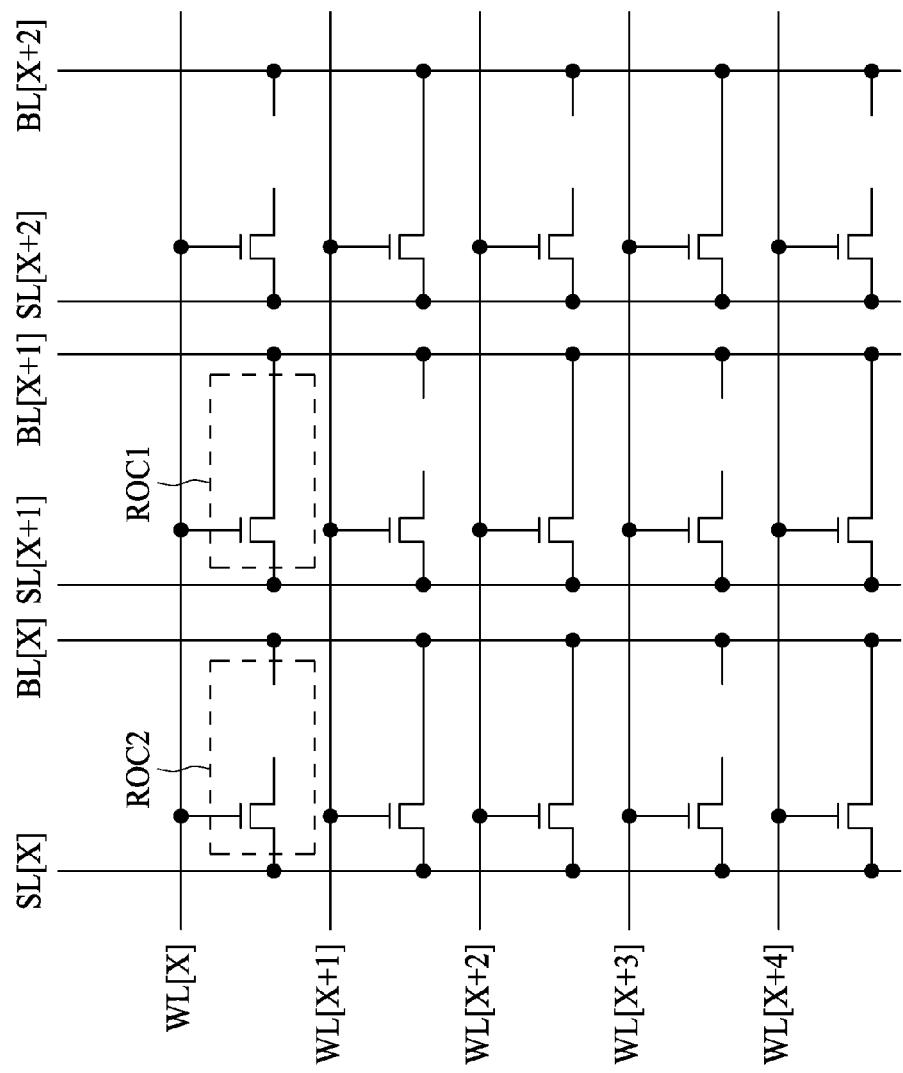
FIG. 3B is a schematic diagram illustrating an array of memory cells of a memory device as shown in FIG. 3A.

FIG. 3B is a schematic diagram illustrating an array of memory cells of a memory device as shown in FIG. 3A.

Referring to FIG. 3B, the memory device R3 may contain an array of ROM cells ROC1 and ROM cells ROC2 for storing data. The memory device R3 is a 3×5 array of memory cells ROC1 and ROC2. In some embodiments, the array of ROM cells ROC1 and ROC2 may be expanded.

A source line SL[X] electrically connects to source 12 of each transistor TR of a column of the ROM cells ROC1 and ROM cells ROC2 of the memory device R3. A source line SL[X+1] electrically connects to source 12 of each transistor TR of another column of the ROM cells ROC1 or the ROM cells ROC2 of the memory device R3. A source line SL[X+2] electrically connects to source 12 of each transistor TR of another column of the ROM cells ROC1 or the ROM cells ROC2 of the memory device R3.

A bit line BL[X] electrically connects to the drain of each transistor TR of a column of the ROM cells ROC1 and the ROM cells ROC2 of the memory device R3. A bit line BL[X+1] electrically connects to the drain of each transistor TR of another column of the ROM cells ROC1 and the ROM cells ROC2 of the memory device R3. A bit line BL[X+2] electrically connects to the drain of each transistor TR of another column of the ROM cells ROC1 and the ROM cells ROC2 the memory device R3.

A word line WL[X] electrically connects to gate 11 of each transistor TR of a row of the ROM cells ROC1 and the ROM cells ROC2 of the memory device R2. A word line WL[X+1] electrically connects to gate 11 of each transistor TR of another row of the ROM cells ROC1 and the ROM cells ROC2 of the memory device R3. A word line WL[X+2] electrically connects to gate 11 of each transistor TR of another row of the ROM cells ROC1 and the ROM cells ROC2 of the memory device R3. A word line WL[X+3] electrically connects to gate 11 of each transistor TR of another row of the ROM cells ROC1 and the ROM cells ROC2 of the memory device R3. A word line WL[X+4] electrically connects to gate 11 of each transistor TR of another row of the ROM cells ROC1 and the ROM cells ROC2 of the memory device R3.

Figure 4:
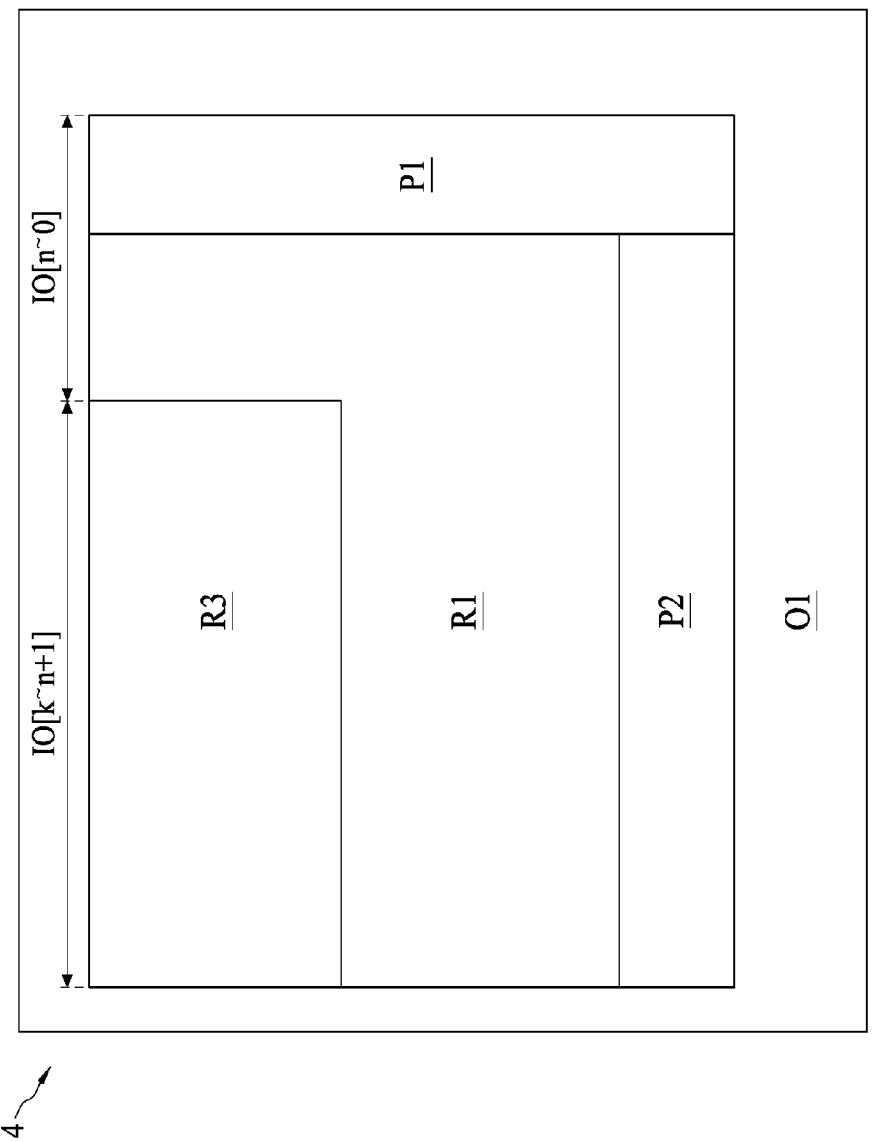
FIG. 4 is a block diagram illustrating another integrated circuit in accordance with some embodiments.

FIG. 4A is a block diagram illustrating another integrated circuit in accordance with some embodiments.

Referring to FIG. 4A, a semiconductor integrated circuit 4 includes memory devices R1 and R3, peripheral devices P1, peripheral circuits P2 and other circuits O1.

The semiconductor integrated circuit 4 may include, for example, a processor, a microprocessor or the like, which operates to control one or more peripheral devices P1 such as a disk drive or the like.

The memory devices R1 and R3 may be provided as internal storage in the semiconductor integrated circuit 2. The memory devices R1 and R3 may contain an array of memory cells for storing data, and row and column decoder circuits (P2) that are peripheral and coupled to the array of memory cells for accessing the memory cells in response to an external address. The memory device R1 may include a RAM. The memory device R3 may include a ROM. The memory device R1 may be accessed by input/output (I/O) [0~n] and the memory device R3 may be accessed by input/output (I/O) [n+1~k], where n and k are positive integers, where k is greater than n.

In accordance with some embodiments of the present disclosure, a semiconductor integrated circuit includes a substrate, a first transistor, a second transistor, a first patterned conductive layer, a storage element and a first conductive element. Each of the first transistor and the second transistor has a source region, a drain region in the substrate and a gate region on the substrate. The first patterned conductive layer, which is over the first and second transistors, has a first portion and a second portion. The first portion of the first patterned conductive layer is electrically connected to the drain region of the first transistor. The second portion of the first patterned conductive layer is electrically connected to the drain region of the second transistor, the first and second portions of the first patterned conductive layer are isolated from each other. The second patterned conductive layer is over the first patterned conductive layer. The storage element is between the first portion of the first patterned conductive layer and the second patterned conductive layer. The first conductive element is between the second portion of the first patterned conductive layer and the second patterned conductive layer.

In accordance with some embodiments of the present disclosure, a semiconductor integrated circuit includes a substrate, a first transistor, a second transistor, a first patterned conductive layer, a second patterned conductive layer and a storage element. Each of the first transistor and the second transistor has a source region, a drain region in the substrate and a gate region on the substrate. The first patterned conductive layer, which is over the first and second transistors, has at least a first portion and a second portion. The first portion of the first patterned conductive layer is electrically connected to the drain region of the first transistor. The second portion of the first patterned conductive layer is electrically connected to the drain region of the second transistor. The first and second portions of the first patterned conductive layer are isolated from each other. The second patterned conductive layer is over the first patterned conductive layer. The storage element is between the first portion of the first patterned conductive layer and the second patterned conductive layer. At least a portion of the second portion of the first patterned conductive layer is isolated from the second patterned conductive layer.

In accordance with some embodiments of the present disclosure, a semiconductor integrated circuit includes a substrate, a first transistor and a first patterned conductive layer. The first transistor has a source region, a drain region in the substrate and a gate region on the substrate. The first patterned conductive layer is electrically connected to the drain region of the first transistor. The first patterned conductive layer includes a first section, a second section and a fusible device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor integrated circuit, comprising:
   a substrate;
   a first transistor and a second transistor each having a source region, a drain region in the substrate and a gate region on the substrate;
   a first patterned conductive layer, over the first and second transistors, having a first portion and a second portion, the first portion of the first patterned conductive layer being electrically connected to the drain region of the first transistor, the second portion of the first patterned conductive layer being electrically connected to the drain region of the second transistor, the first and second portions of the first patterned conductive layer being isolated from each other;
   a second patterned conductive layer over the first patterned conductive layer;
   a storage element between the first portion of the first patterned conductive layer and the second patterned conductive layer; and
   a first conductive element directly connected from the second portion of the first patterned conductive layer to the second patterned conductive layer;
   wherein the second portion of the first patterned conductive layer further comprises a first section and a second section, and the first section is electrically isolated from the second section and the drain region of the second transistor.

2. The semiconductor integrated circuit of claim 1 further comprising a third transistor having a source region, a drain region in the substrate and a gate region on the substrate, wherein first patterned conductive layer on the third transistor further comprises a third portion electrically connected to the drain region of the third transistor, wherein the first, second and third portions of the first patterned conductive layer are isolated from one another.

3. The semiconductor integrated circuit of claim 2, wherein the whole third portion of the first patterned conductive layer is isolated from the second patterned conductive layer.

4. The semiconductor integrated circuit of claim 2, wherein at least a portion of the third portion of the first patterned conductive layer is isolated from the second patterned conductive layer.

5. The semiconductor integrated circuit of claim 4, wherein the third portion of the first patterned conductive layer and/or the second patterned conductive layer further comprises a fusible device.

6. The semiconductor integrated circuit of claim 1, further comprising a third transistor having a source region, a drain region in the substrate and a gate region on the substrate, wherein the first patterned conductive layer is disposed over the third transistor and further comprises a third portion, wherein the first, second and third portions of the first patterned conductive layer are isolated from one another and the third portion of the first patterned conductive layer comprises a first section and a second section isolated from the first section.

7. The semiconductor integrated circuit of claim 6 further comprising a second conductive element, the second conductive element electrically connects the first section of the third portion of the first patterned conductive layer to the second patterned conductive layer.

8. The semiconductor integrated circuit of claim 6, wherein the second section of the third portion of the first patterned conductive layer is electrically connected to the drain region of the third transistor.

9. The semiconductor integrated circuit of claim 1, wherein the first conductive element is a fusible device.

10. The semiconductor integrated circuit of claim 1, wherein the second portion of the first patterned conductive layer further comprises a fusible device.

11. The semiconductor integrated circuit of claim 10, wherein the fusible device divides the second portion of the first patterned conductive layer into the first section and the second section.

12. A semiconductor integrated circuit, comprising:
a substrate;
a first transistor and a second transistor each having a source region, a drain region in the substrate and a gate region on the substrate;
a first patterned conductive layer, over the first and second transistors, having at least a first portion and a second portion, the first portion of the first patterned conductive layer being electrically connected to the drain region of the first transistor, the second portion of the first patterned conductive layer being electrically connected to the drain region of the second transistor, the first and second portions of the first patterned conductive layer being isolated from each other;
a second patterned conductive layer over the first patterned conductive layer; and
a storage element between the first portion of the first patterned conductive layer and the second patterned conductive layer,
wherein the second portion of the first patterned conductive layer comprises a first section and a second section isolated from the first section, and the first section and the second section are formed on a same layer on the substrate.

13. The semiconductor integrated circuit of claim 12, wherein the whole second portion of the first patterned conductive layer is isolated from the second patterned conductive layer.

14. The semiconductor integrated circuit of claim 12, wherein the second portion of the first patterned conductive layer and/or the second patterned conductive layer further comprises a fusible device.

15. The semiconductor integrated circuit of claim 12 further comprising a conductive element, the conductive element electrically connects the first section of the second portion of the first patterned conductive layer to the second patterned conductive layer.

16. A semiconductor integrated circuit, comprising:
a substrate;
a first transistor and a second transistor each having a source region, a drain region in the substrate and a gate region on the substrate;
a first patterned conductive layer having a first portion and a second portion, the first portion electrically connected to the drain region of the first transistor, and the first portion comprising a first section, a second section and a fusible device, and the second portion electrically connected to the drain region of the second transistor;
wherein the first section, the second section and the fusible device are formed on a same height measured from the substrate.

17. The semiconductor integrated circuit of claim 16, wherein the fusible device is disposed between the first section and the second section.

18. The semiconductor integrated circuit of claim 16 further comprising a conductive element and a second patterned conductive layer over the first patterned conductive layer, wherein the conductive element electrically connects the first section of the first patterned conductive layer to the second patterned conductive layer.

* * * * *